United States Patent [19]

Uchida

[11] Patent Number: 4,837,460
[45] Date of Patent: * Jun. 6, 1989

[54] COMPLEMENTARY MOS CIRCUIT HAVING DECREASED PARASITIC CAPACITANCE

[75] Inventor: Yukimasa Uchida, Yokohama, Japan

[73] Assignee: Kabushiki Kaisha Toshiba, Kanagawa, Japan

[*] Notice: The portion of the term of this patent subsequent to Apr. 29, 2003 has been disclaimed.

[21] Appl. No.: 573,202

[22] Filed: Jan. 23, 1984

[30] Foreign Application Priority Data

Feb. 21, 1983 [JP] Japan .................. 58-27470

[51] Int. Cl.⁴ ............................................. H03K 17/14
[52] U.S. Cl. .................. 307/296.8; 307/304; 307/296.2
[58] Field of Search .............. 307/200 B, 451, 296 R, 307/297, 304; 357/42; 323/311-313

[56] References Cited

U.S. PATENT DOCUMENTS

| | | | |
|---|---|---|---|
| 3,855,549 | 12/1974 | Huener et al. | 307/451 X |
| 4,006,491 | 2/1977 | Alaspa et al. | 307/304 |
| 4,039,869 | 8/1977 | Goldman et al. | 307/304 |
| 4,122,360 | 10/1978 | Kawagai et al. | 307/450 X |
| 4,209,713 | 6/1980 | Satou et al. | 357/42 X |
| 4,305,009 | 12/1981 | Miyagawa et al. | 307/264 |
| 4,585,955 | 4/1986 | Uchida | 307/200 B X |

FOREIGN PATENT DOCUMENTS

| | | |
|---|---|---|
| 0063483 | 10/1982 | European Pat. Off. . |
| 0091861 | 7/1980 | Japan .................. 357/42 |
| 58-2061 | 4/1983 | Japan .. |
| 58-82560 | 5/1983 | Japan . |

OTHER PUBLICATIONS

"Comment Se Premunir Du Latch-Up Dans Les Curcuits Integres CMOS", *Electronique Industrielle*, No. 18/15-5-81.

Primary Examiner—Stanley D. Miller
Assistant Examiner—D. R. Hudspeth
Attorney, Agent, or Firm—Foley & Lardner, Schwartz, Jeffery, Schwaab, Mack, Blumenthal & Evans

[57] ABSTRACT

The substrate voltages $V_1$ and $V_2$ of NMOS and PMOS transistors, respectively, which constitute a CMOS circuit and the source voltages $V_3$ and $V_4$ of these transistors have the following relationship:

$$V_1 < V_3 < V_4 < V_2$$

(where $V_1$ may be equal to $V_3$ or $V_4$ may be equal to $V_2$). In order to maintain the above relationship, it is preferable that internal power supply means are formed on the substrate upon which is also formed the CMOS circuit so that some of the above voltages may be produced.

3 Claims, 6 Drawing Sheets

COMPLEMENTARY MOS CIRCUIT HAVING DECREASED PARASITIC CAPACITANCE

BACKGROUND OF THE INVENTION

The present invention relates to a semiconductor device in which a complementary MOS circuit is formed on a semiconductor substrate.

With the recent development of MOS-LSI techniques, CMOS-LSIs have attracted much attention because of their low power consumption so that they will be widely used in various fields. However, they have some problems which may be summarized as follows:

(1) Since the value of the parasitic junction capacitance between a substrate, source and drain is high, the high speed or faster operation cannot be attained.

(2) Since a PNPN switch between the substrate and the source is turned on, the latch-up problem results.

(3) Even when the dimensions of an element are decreased, the high speed operation cannot be attained.

(4) Adverse effects due to variations in external power supply cannot be avoided.

SUMMARY OF THE INVENTION

One of the objects of the present invention is to provide a semiconductor device in which the value of the parasitic junction capacitance between a substrate, a source and a drain of PMOS transistors and NMOS transistors is decreased so that the high speed or faster operation can be attained.

Another object of the present invention is to provide a semiconductor device in which a PNPN switch formed between the substrate and the source of each PMOS and NMOS transistors can be prevented from being turned on so that latch-up susceptibility can be minimized.

A further object of the present invention is to provide a semiconductor device in which an element is reduced in dimension by scaling so that the high speed or faster operation may be ensured.

Yet a further object of the present invention is to provide a semiconductor device whose performance is not adversely affected by the variations of an external power supply and whose operational margin may be improved.

To the above and other ends, the present invention provides a semiconductor device in which the gates of a NMOS transistor and a PMOS transistor, which constitute a CMOS circuit on a semiconductor substrate of one type or polarity, are connected in common to an input terminal while the drains thereof are connected in common to an output terminal; internal power supply means (whose output voltages are $V_3$ and $V_4$ respectively) are provided which respond to externally supplied voltages ($V_1$ and $V_2$) to as to deliver the output voltages $V_3$ and $V_4$ (which will not vary in response to the variations in externally supplied voltages $V_1$ and $V_2$); the voltages $V_1$, $V_2$, $V_3$ and $V_4$ are applied to the substrate terminal of the NMOS transistor, the substrate terminal of the PMOS transistor, the source terminal of the NMOS transistor and the source terminal of the PMOS transistor, respectively; and in order to apply a predetermined bias voltage across each junction of these MOS transistors, the following relationship is maintained among the voltages $V_1$, $V_2$, $V_3$ and $V_4$:

$$V_1 < V_3 < V_4 < V_2$$

where $V_1$ may be equal to $V_3$ or $V_4$ may be equal to $V_2$.

The above and other objects, effects, features and advantages of the present invention will become more apparent from the following description of preferred embodiments thereof taken in conjunction with the accompanying drawings.

BRIEF DESCRIPTION OF THE DRAWINGS

The same reference numerals are used to designate similar parts throughout the figures.

DETAILED DESCRIPTION OF THE INVENTION

Figure 8:
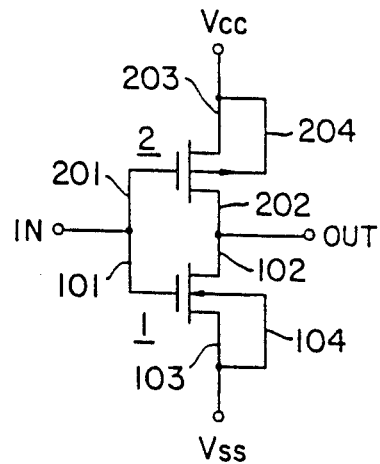
FIG. 8 shows a circuit diagram of a prior art CMOS inverter.

Prior to the description of the preferred embodiments of the present invention, a conventional CMOS inverter will be briefly described with reference to FIG. 8 so that the problems encountered in the conventional CMOS devices may be more particularly pointed out. The CMOS inverter as shown in FIG. 8 comprises an n-channel MOS transistor 1 (to be referred as "NMOS transistor" in this specification) and a p-channel MOS transistor 2 (to be referred as "PMOS transistor" in this specification). Gate terminals 101 and 201 of NMOS and PMOS transistors 1 and 2 are connected in common to an input terminal IN while drains 102 and 202 of NMOS and PMOS transistors 1 and 2 are connected in common to an output terminal OUT. The source terminal 103 and the substrate terminal 104 of NMOS transistor 1 is connected in common to an external reference power supply Vss which supplies the power to an LSI chip. The source terminal 203 and the substrate terminal 204 of PMOS transistor 2 are connected in common to an external power supply Vcc.

The conventional CMOS inverter with the above-described construction has the following problems.

Firstly, each of the substrates of PMOS and NMOS transistors, which constitute a CMOS circuit, is connected not only to the external power supply terminal Vcc but also to the external reference power supply terminal Vss so that there exists a parasitic capacitance between the substrate, source and drain of each of PMOS and NMOS transistors. As a result, high speed operation cannot be attained.

Secondly, in the PMOS transistor which is connected to the external power supply Vcc and in the NMOS transistor which is connected to the external reference power supply Vss, the potential of the source is the same as the potential of the substrate. As a result, in response to the capacitance coupling, heat, light excitation, noise from power supplies and so on, a PNPN switch made up of the source P+ and the substrate N of the PMOS transistor and the substrate P and the source $N^{30}$ of NMOS transistor is turned on so that the latch-up condition which is similar to that encountered in a thyristor results.

Thirdly, in order to ensure the high speed operation, scaling of PMOS and NMOS transistors is required, but when the dimensions of an element are reduced, an externally supplied power supply voltage is limited. For instance, if a power supply is a constant voltage power supply of 5 V, scaling is limited. More particularly, if the dimensions of an element are reduced by scaling, the following problems arise: (1) the punch-through phenomenon, (2 the breakdown phenomenon, (3) trapping of hot carriers in a gate insulation layer, (4) the injection of minority carriers and (5) the increase in substrate current. Because of these problems, the CMOS inverter will not operate or reliability in operation is degraded. As a result, scaling is limited, and consequently it becomes difficult to attain the high speed operation by scaling.

Fourthly, the operation of circuits on an LSI chip is adversely affected by the variations in voltage supplied from the external power supply Vcc or the external reference power supply Vss, noise, spikes or the like. That is, the performance of circuits is dependent upon external power supplies. As a result, the margin of operation is very small or narrow.

The Invention

Next referring to FIGS. 1 through 7B, the preferred embodiments of the present invention will be described.

Figure 1:
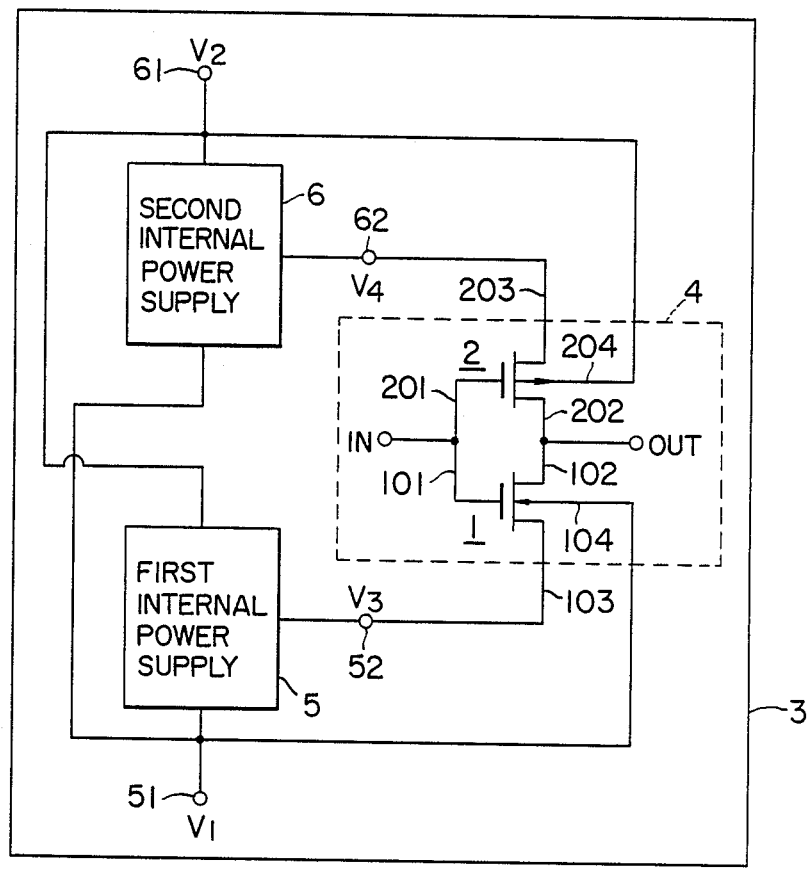
FIG. 1 is a circuit diagram of a first embodiment of a CMOS circuit in accordance with the present invention.

Referring first to FIG. 1, in addition to a CMOS inverter 4, a first internal power supply 5 and a second internal power supply 6 are formed over a semiconductor substrate. The first and second internal power supplies 5 and a convert first and second external voltages $V_1$ and $V_2$ supplied at first and second external power supply terminals 51 and 61, respectively, into first and second internal voltages $V_3$ and $V_4$, respectively. The voltages $V_3$ and $V_4$ are applied through internal voltage terminals 52 and 62, respectively, to the source terminals 103 and 203, respectively, of the NMOS and PMOS transistors 1 and 2. The first and second external voltages $V_1$ and $V_2$ are applied to the substrate terminals 104 and 204 of the NMOS and PMOS transistors 1 and 2. The above-described external and internal voltages have the following relationship:

$$V_1 < V_3 < V_4 < V_2.$$

For instance, $V_1 = 0$ volt; $V_2 = 5$ V; $V_3 = 1$ V; and $V_4 = 4$ V.

The voltages are applied to the CMOS inverter 4 in the manner described above so that the substrate bias voltage of 1 V is applied across the source terminal 103 and the substrate terminal 104 of the NMOS transistor 1. In like manner, the substrate bias voltage of 1 V is applied across the source terminal 203 and the substrate terminal 203 of the PMOS transistor 2. As a result, the value of he parasitic junction capacitance of the CMOS inverter 4 is remarkably decreased so that high speed operation can be attained. The PN junctions of the PNPN switch made up of the source $P^{30}$ and the substrate N of the PMOS transistor 2 and the substrate P and the source $N^{30}$ of the NMOS transistor are reverse biased so that the latch-up condition due to external causes can be almost avoided. Furthermore, the first and second internal power supplies 5 and 6 supply the voltages $V_3$ and $V_4$. As a consequence, the package density of circuits can be considerably increased while the externally supplied voltages are maintained constant. Furthermore the operation of the CMOS inverter 4 is not adversely affected by the variations in externally supplied voltage.

In response to the input signal whose amplitude varies between $V_1$ and $V_2$ or between $V_3$ and $V_4$, the CMOS inverter 4 delivers the output whose amplitude is varied between $V_3$ and $V_4$, the amplitude being reversed.

Figure 2:
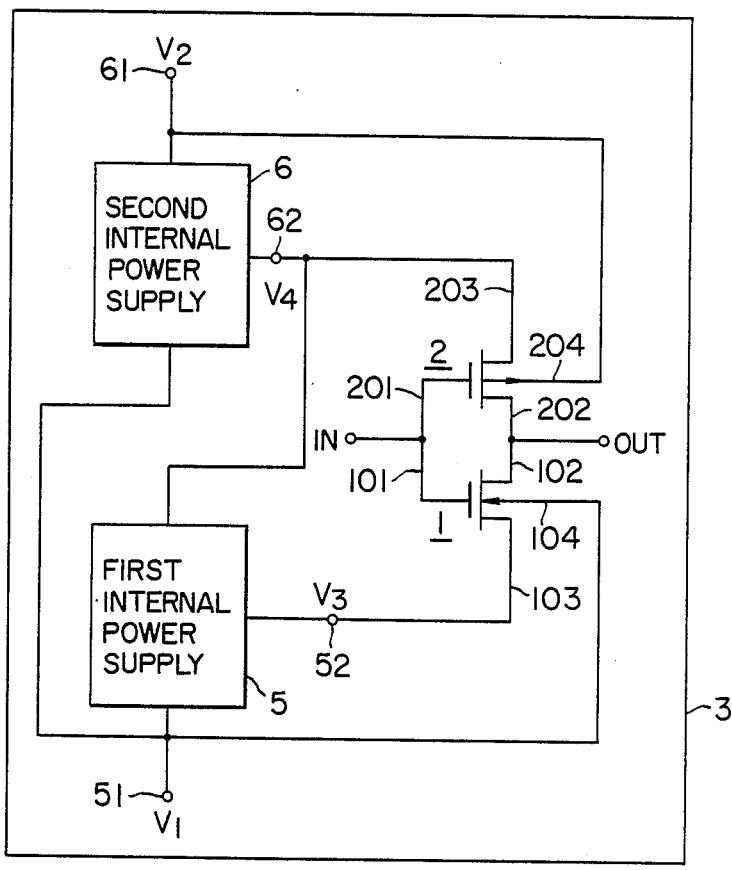
FIG. 2 is a circuit diagram of a second embodiment of the present invention.

Referring next to FIG. 2, the second embodiment of the present invention will be described. The second internal power supply 6 converts the externally supplied voltages $V_1$ and $V_2$ into a second internally supplied voltage $V_4$ which in torn is delivered through the terminal 62. The first internal power supply 5 converts the first externally supplied voltage $V_1$ and the output $V_4$ of the second internal power supply 6 into a second internally supplied voltage $V_3$ which in turn is delivered through the terminal 52. The externally supplied voltages and the internally supplied voltages have the same relationship as the first embodiment; that is, $$V_1 < V_3 < V_4 < V_2$$

Figure 3:
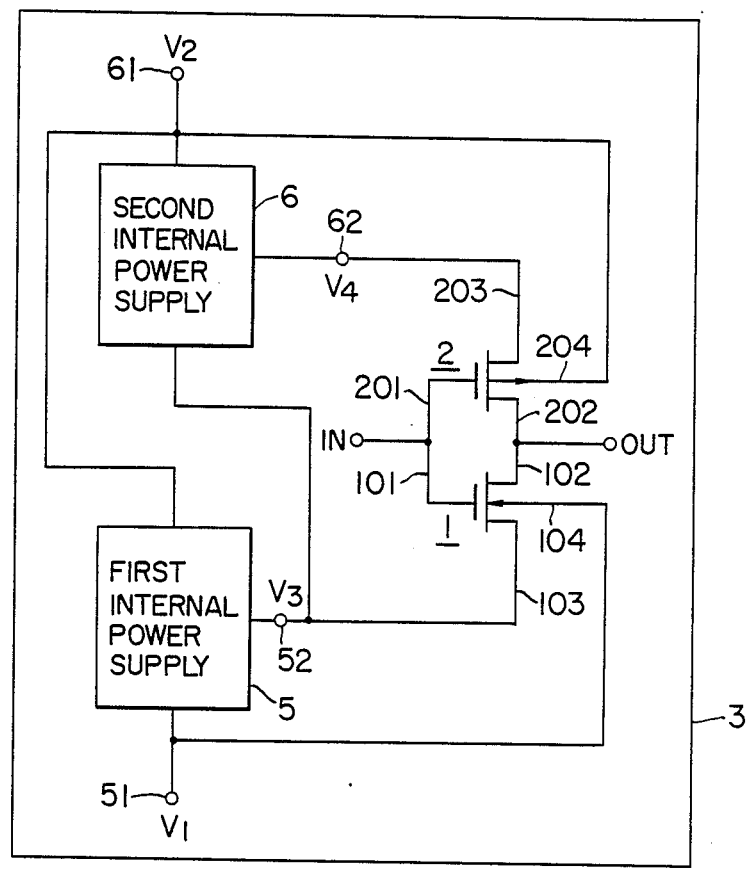
FIG. 3 is a circuit diagram of a third embodiment of the present invention.

Referring next to FIG. 3, the third embodiment of the present invention will be described. The first internal power supply 5 converts the first and second externally supplied voltages $V_1$ and $V_2$ into a first internally supplied voltage $V_3$ which in turn is delivered through the terminal 52. The second internal power supply 6 converts the second externally supplied voltage $V_2$ and the output $V_3$ of the first internal power supply 5 into a second internally delivered voltage $V_4$ which in turn is delivered through the terminal 62. As is the case of the first or second embodiment, the following relationship is held:

$$V_1 < V_3 < V_4 < V_2$$

Figure 4:
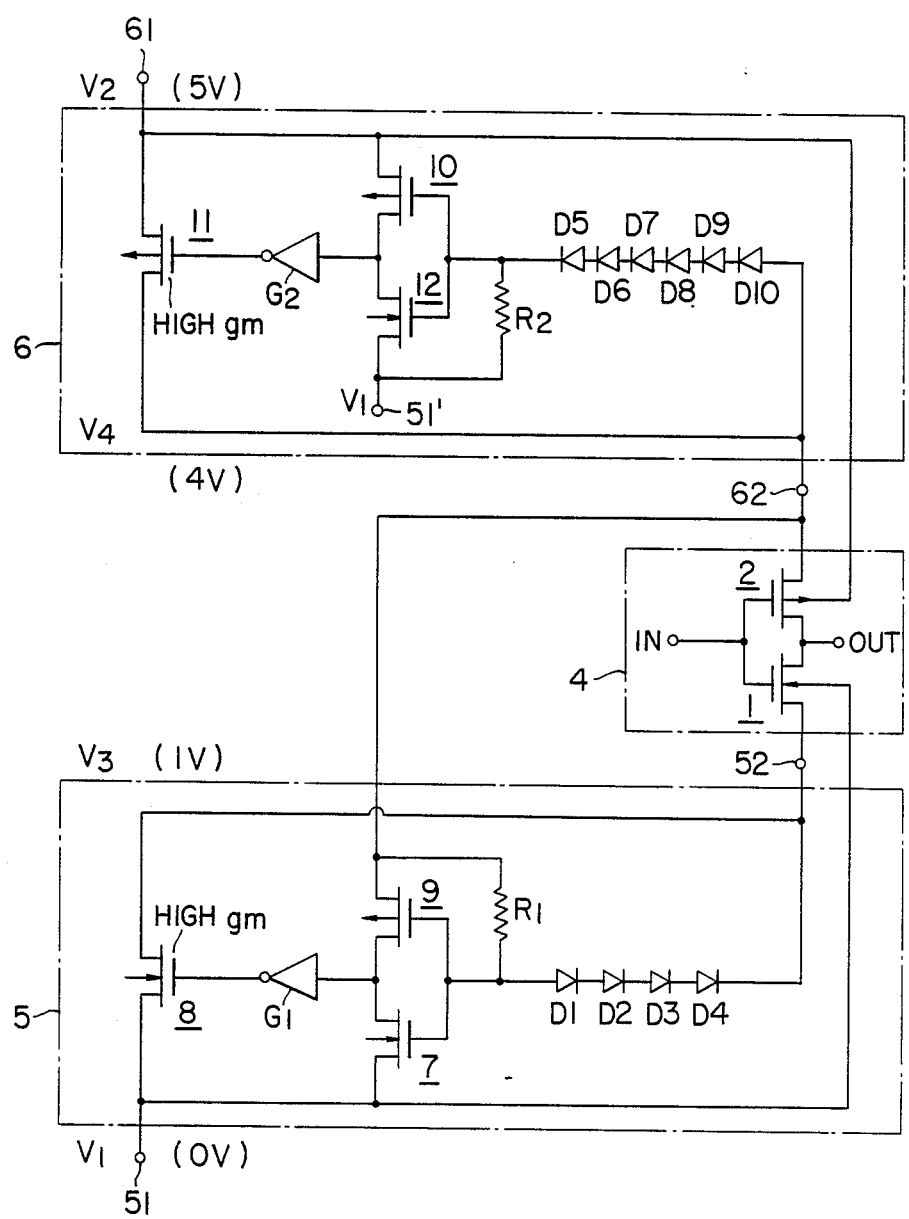
FIG. 4 is a detailed circuit diagram of first and second internal power supplies as shown in FIG. 3.

FIG. 4 shows in detail the first and second internal power supplies 5 and 6 as shown in FIG. 2. The first externally supplied voltage $V_1$ is applied to the source terminals of NMOS transistors 7 and 8. The NMOS transistor 7 and a PMOS transistor 9 constitute a CMOS inverter the output of which is applied to the gate terminal of the NMOS transistor 8 through a NOT gate $G_1$. The input to the CMOS inverter is the output from a constant voltage circuit consisting of diodes $D_1$, $D_2$, $D_3$ and $D_4$ and a resistor $R_1$. The first internal power supply 5 detects whether the voltage at the terminal 52 is higher or lower than a threshold value and the detected output voltage is fed back so that a predetermined voltage is produced. The second internally supplied voltage $V_4$ is applied to the source terminal of the PMOS transistor 9 and one end of the resistor $R_1$. The drain terminal of the NMOS transistor 8 with a high mutual conductance gm is connected to the cathode of the diode $D_4$ and to the terminal 52. The first internally supplied voltage $V_3$ is delivered through the terminal 52. The second externally supplied voltage $V_2$ is applied through the terminal 61 to the source terminals of PMOS transistors 10 and 11. The PMOS transistor 10 and a NMOS transistor 12 constitute a CMOS inverter whose output is delivered through a NOT gate $G_2$ to the gate terminal of the PMOS transistor 11. The input to the CMOS inverter is the output of a constant voltage circuit comprising diodes $D_5$ through $D_{10}$ and a resistor $R_2$. The first externally supplied voltage $V_1$ is applied to the source terminal of the NMOS transistor 12 and one end of the resistor $R_2$. The drain terminal of the PMOS transistor 11 with a high mutual conductance gm is connected to the anode of the diode $D_{10}$ and the terminal 62. The second internally supplied voltage $V_4$ is delivered through the terminal 62.

Assume that $V_1=0$ V and $V_2=5$ V. Then the second internal power supply 6 delivers the constant voltage $(V_{D2}=3$ V$)$ of the constant voltage circuit consisting of the diodes $D_5$ through $D_{10}$ and the resistor $R_2$ and the second internally supplied voltage $V_4=V_{D2}+V_{T2}=3+1=4$ V dependent upon the threshold value $V_{T2}=1$ V of the CMOS inverter consisting of the NMOS transistor 10 and the PMOS transistor 12. The first internal power supply 5 delivers the constant voltage $V_{D1}=2$ V of the constant voltage circuit consisting of the diodes $V_1$ through $V_4$ and the resistor $R_1$ and the first internally supplied voltage $V=V_4-V_{D1}-V_{T1}=4-2=1$ V which is dependent upon the threshold value $V_{T1}=1$ V of the CMOS inverter consisting of the NMOS transistor 9 and the PMOS transistor 7. Both the first and second internal power supplies 5 and 6 have a feedback loop so that a stabilized constant voltage output can be obtained.

Figure 5:
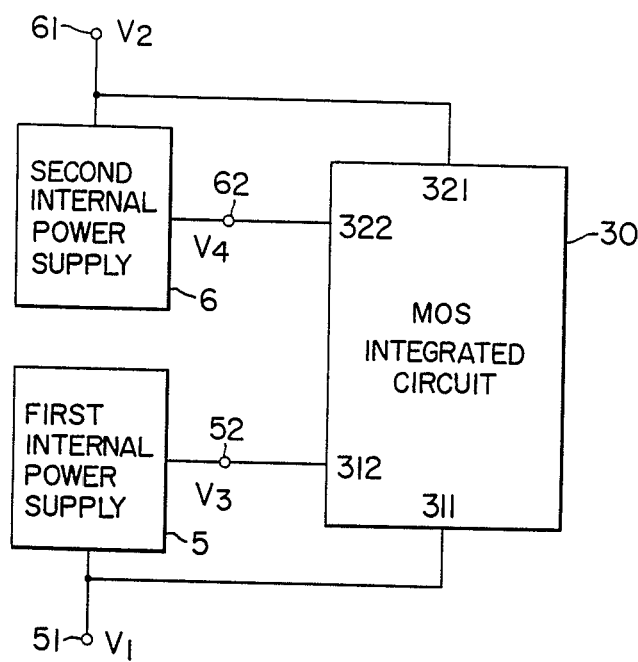
FIG. 5 shows a fourth embodiment of the present invention.
Figure 6A:
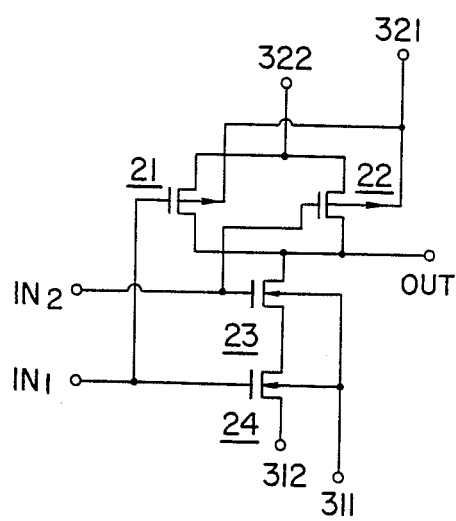
FIG. 6A shows a fourth embodiment of the present invention.
Figure 6B:
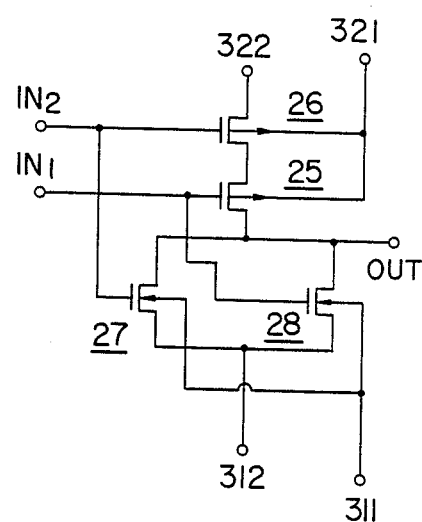
FIG. 6B shows a fourth embodiment of the present invention.

Referring next to FIGS. 5, 6A and 6B, the third embodiment of the present invention will be described. FIGS. 6A and 6B show in detail a MOS integrated circuit 30 shown in FIG. 5. FIG. 6A shows a NAND gate comprising PMOS transistors 21 and 22 and NMOS transistors 23 and 24 while FIG. 6B shows a NOR gate consisting of PMOS transistors 25 and 26 and NMOS transistors 27 and 28. The input signal is applied to terminals $IN_1$ and $IN_2$ while the output signal is derived from an output terminal OUT.

Figure 7A:
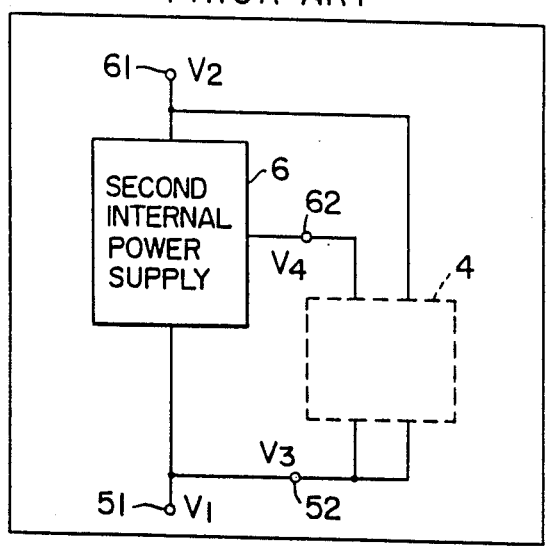
FIG. 7A shows a fifth embodiment of the present invention.
Figure 7B:
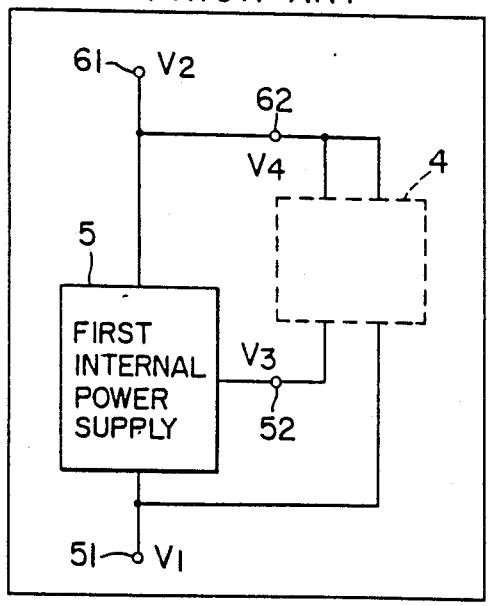
FIG. 7B shows a fifth embodiment of the present invention.

FIGS. 7A and 7B show the fourth embodiment of the present invention in which the first or the second internal power supply is eliminated. More particularly, in FIG. 7A, a first internal power supply is eliminated and the first externally supplied voltage terminal 51 is directly connected to the first internally supplied voltage terminal 52. In FIG. 7B, a second internal power supply is eliminated and the second externally supplied voltage terminal 61 is directly connected to the second internally supplied voltage terminal 62.

In the circuit as shown in FIG. 7A, the externally and internally supplied voltages have the following relationship:

$$V_1=V_3<V_4<V_2$$

In the circuit as shown in FIG. 7B, the externally and internally supplied voltages have the following relationship:

$$V_1<V_3<V_4=V_2$$

Therefore the variations in externally supplied voltage affect one of a pair of MOS transistors of a CMOS, but the other MOS transistor receives a predetermined voltage so that no adverse problem will result in practice.

As described above, according to the present invention, in a semiconductor device in which the gates of NMOS and PMOS transistors which constitute a CMOS circuit on a semiconductor substrate are connected in common to an input terminal while the drains of these NMOS and PMOS transistors are connected in common to an output terminal, there are provided internal power supplies which deliver the output voltages $V_3$ and $V_4$, respectively, in response to externally supplied voltages $V_1$ and $V_2$; these voltages $V_1$, $V_2$, $V_3$ and $V_4$ are applied to the substrate terminal of the NMOS transistor, the substrate terminal of the PMOS transistor, the source terminal of the NMOS transistor and the source terminal of the PMOS transistors, respectively; and the following relationship is maintained.

$$V_1<V_3<V_4<V_2$$

(where $V_1$ may be to $V_3$ or $V_2$ may be equal to $V_4$) As a result, the present invention can provide a semiconductor device which has the following effects.

Firstly, since the relationship is held $$V_1<V_3<V_4<V_2$$

(where $V_1$ may be equal to $V_3$ or $V_4$ may be equal to $V_2$) and a reverse bias voltage is applied between the substrate and source of each of NMOS and PMOS transistors, the value of the parasitic junction capacitance can be remarkably reduced so that the high speed operation can be attained.

Secondly, since the following relationship is held $$V_1<V_3<V_4<V_2$$

(where $V_1$ may be equal to $V_3$ or $V_4$ may be equal to $V_2$) and reverse bias voltages are applied across all the PN junctions of a PNPN switch which is made up of PMOS and NMOS transistors, the PN junctions will not be forward biased in response to external disturbances. As a result, there can be provided a semiconductor device in which latch-up susceptibility may be reduced to a minimum.

Thirdly, since the internal power supplies are provided so as to hold the following relationship $$V_1<V_3<V_4<V_2$$

(where $V_1$ may be equal to $V_3$ or $V_4$ may be equal to $V_2$), the dimensions of an element can be decreased by scaling while an externally supplied voltage is maintained at a predetermined value (for instance $V_2=5$ V). As a result, a high packaging density can be obtained and the high-speed operation can be attained.

Fourthly, since the internal power supplies are provided, there can be provided a semiconductor device whose performance will not be adversely affected by the variations in externally supplied voltage and whose operation margin is wide.

What is claimed is:

1. A complementary MOS circuit comprising:
a complementary MOS circuit means comprising an n-channel MOS transistor on a semiconductor substrate of p-type and a p-channel MOS transistor on a semiconductor substrate n-type, the gate terminals of said n-channel MOS transistor and said p-channel MOS transistor being connected electrically in common to an input terminal, and the drain terminals of said n-channel MOS transistor and said p-channel MOS transistor being connected electrically in common to an output terminal;

first power supply means for applying first and second externally supplied voltages to the substrate terminals, respectively, of said n-channel MOS transistor and said p-channel MOS transistor;

second power supply means for applying first and second internally supplied voltages to the source terminals, respectively, of said n-channel MOS transistor and said p-channel MOS transistor; and a constant voltage circuit means comprising a means for receiving through one of a first and a second externally supplied power terminal, one of a first and a second externally supplied voltage and for converting said one externally supplied voltage into one of said first and second internally supplied voltages;

said first and second externally supplied power supply terminals being electrically connected to the substrate terminals, respectively, of said n-channel MOS transistor and said p-channel MOS transistor;

said first and second internally supplied voltages being connected electrically to the source terminals, respectively, of said n-channel MOS transistor and said p-channel MOS transistor; and wherein the absolute value of the difference between said first and second internally supplied voltages is maintained constant regardless of the variation in the absolute value of the difference between said first and second externally supplied voltages.

2. A complementary MOS circuit as set forth in claim 1, wherein said first externally supplied voltage equals said first internally supplied voltage; and wherein said first internally supplied voltage is less than said second internally supplied voltage; and wherein said second internally supplied voltage is less than said second externally supplied voltage.

3. A complementary MOS circuit as set forth in claim 1, wherein said first externally supplied voltage is less than said first internally supplied voltage; and wherein said first internally supplied voltage is less than said second internally supplied voltage; and wherein said second internally supplied voltage equals said second externally supplied voltage.

* * * * *